US006940899B2

(12) United States Patent
Heath (10) Patent No.: US 6,940,899 B2
(45) Date of Patent: Sep. 6, 2005

(54) SYSTEM EMPLOYING DATA COMPRESSION TRANSPARENT MODE WITH COMPRESSION PARAMETER NEGOTIATION

(75) Inventor: Robert G. Heath, San Diego, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 916 days.

(21) Appl. No.: 09/810,769

(22) Filed: Mar. 16, 2001

(65) Prior Publication Data

US 2002/0009136 A1 Jan. 24, 2002

Related U.S. Application Data

(60) Provisional application No. 60/238,356, filed on Oct. 6, 2000, and provisional application No. 60/192,841, filed on Mar. 29, 2000.

(51) Int. Cl.[7] .............................................. H04B 1/66
(52) U.S. Cl. ................................. 375/240; 375/240.25
(58) Field of Search ..................... 375/240; 455/414.1; 382/232; 714/758

(56) References Cited

U.S. PATENT DOCUMENTS

| 4,730,348 | A | | 3/1988 | MacCrisken |
| 5,729,223 | A | | 3/1998 | Trissel |
| 5,889,818 | A | | 3/1999 | Spiess |
| 6,289,130 | B1 | * | 9/2001 | Cooklev ..................... 382/232 |

OTHER PUBLICATIONS

International Telecommunication Union, International Telegraph and Telephone Consultative Committee, Recommendation V. 42 bis, "Data Compression Procedures for Data Circuit Terminating Equipment (DCE) Using Error Correcting Procedures", 1990.*

International Telecommunication Union, Data Communication Over the Telephone Network, Recommendation V.44, "Data Compression Procedures", 2000.

Committee Contribution, Technical Committee TR–30 Meetings, Telecommunications Industry Association (TIA), Newport Beach, CA, Nov. 22, 2000, pp. 1–3.

ITU—Telecommunications Standardisation Sector, Temporary Document Q8–041R4, Study Group 16.

Dictionary Methods, 3.17 The V.42bis Protocol, 3.18 Zip Gzip, pp. 148–149.

* cited by examiner

Primary Examiner—Stephen Chin
Assistant Examiner—Curtis Odom
(74) Attorney, Agent, or Firm—John T. Whelan (57) ABSTRACT

A method and an apparatus are provided for performing parameter negotiation in a data compression link. When data is sent along the communication link in a compressed form, the escape character is not modified. When sending data in an uncompressed form, the escape character is followed by a command and the escape character is modified. A parameter mode can be entered when data is being sent uncompressed. During parameter mode, parameter negotiation between the modem peers can be accomplished without interrupting the communication link.

28 Claims, 3 Drawing Sheets

FIG. 2
(PRIOR ART)

FIGURE 3

SYSTEM EMPLOYING DATA COMPRESSION TRANSPARENT MODE WITH COMPRESSION PARAMETER NEGOTIATION

This application claims the benefit of U.S. provisional application Ser. No. 60/192,841, filed Mar. 29, 2000 and of U.S. provisional application Ser. No. 60/238,356 filed Oct. 6, 2000 the entire contents of which are hereby incorporated by reference.

BACKGROUND OF THE INVENTION

1. Field of the Invention

The present invention relates to data compression between an encoder and a decoder across a communication channel. More particularly, the present invention relates to toggling between uncompressed data flow and compressed data flow for a communication link whenever the compression ratio is favorable. In addition, this invention relates to negotiating or modifying data compression parameters and achieving algorithm switching for data compression without first interrupting and then restoring the communication link.

2. Description of the Related Art

Existing systems employing data compression (e.g., modem peers on an ITU-T Recommendation V.42 link) can operate in a transparent mode in which characters are transmitted in uncompressed form. The data compression module, (e.g., data compression as described in U.S. Pat. No. 5,955,976 and incorporated by reference herein) is active, but does not influence data transmission.

In existing data compression systems, modification and negotiation of data compression parameters requite that the communication channel is first torn down. In addition, if a switch to a different data compression algorithm is needed, a data communication channel must be torn down and later reestablished in existing communication systems employing V.42 communication links or other similar links.

A need therefore exists for a method and apparatus that allows for modification and negotiation of data compression parameters and for switching to a different data compression algorithm without first tearing down and then reestablishing the communication link. A need also exists for sending uncompressed data across V.42 links or similar links when compression ratios are favorable for such communication.

SUMMARY OF THE INVENTION

It is therefore an object of the present invention to provide a method and apparatus that accomplish modification and negotiation of data compression parameters and switching of data compression algorithms without the deficiencies of prior data compression systems.

It is also an object of the present invention to provide a parameter mode that allows for parameter modification and negotiation of data compression parameters without interrupting the data communication link between the encoder and decoder.

It is a further object of the present invention to provide a parameter mode that allows for switching between data compression algorithms without interrupting the data communication link established between the encoder and the decoder.

It is also an object of the present invention to provide access to a parameter mode from a transparent mode in which data is transmitted uncompressed.

It is still yet an object of the present invention to provide a transparent mode wherein the decoder does not update a dictionary storing data and their compressed equivalents.

It is also an object of the invention to re-initialize the dictionaries in the encoder and the decoder when transitioning from transparent mode to a compression mode in which data is transmitted in a compressed format.

Another object of the present invention is the implementation of escape character modification in the transparent mode only, as opposed to modification thereof in both transparent and compression modes.

These and other objects are achieved by a data compression system and method that allows for compressed mode wherein data is compressed by an encoder before being transmitted, a transparent mode wherein data is transmitted uncompressed, and a parameter mode wherein modification and negotiation of data compression parameters can be achieved without first interrupting the communication link. The transparent mode is used when the compression ratio for a link favors efficient data transmission without compression. The encoder dictionary is constructed in transparent mode to determine when it is favorable to return to compressed mode. The decoder dictionary is not constructed in transparent mode. Both encoder and decoder dictionaries are re-initialized when transitioning from transparent mode to compressed mode. Selected commands and control codes are used by the encoder to transfer between the modes, to modify or negotiate data compression parameters, and to change data compression algorithms. Entry and exit to and from parameter mode is accomplished through the transparent mode. The escape character, which indicates the beginning of a command sequence to the decoder, is only modified while in the transparent mode and indicates that a command is to follow.

BRIEF DESCRIPTION OF THE DRAWINGS

These and other objects, advantages and novel features of the invention will be more readily appreciated from the following detailed description when read in conjunction with the accompanying drawings, in which.

DETAILED DESCRIPTION OF THE PREFERRED EMBODIMENTS

Figure 1:
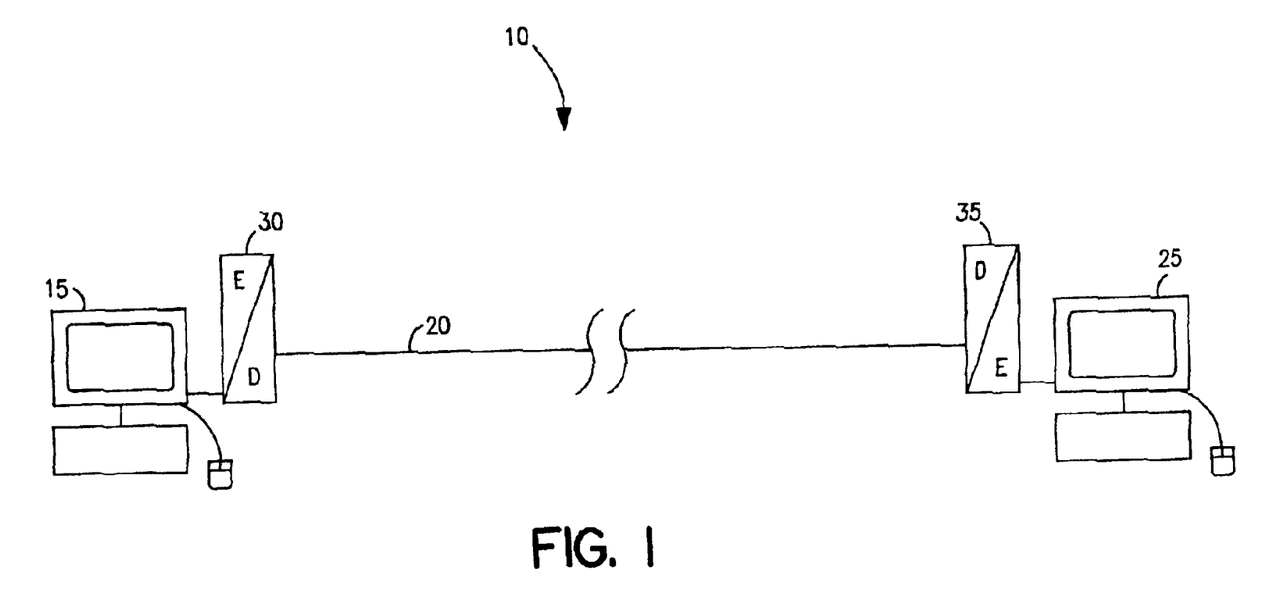
FIG. 1 illustrates a pair of computers connected by a communication link and employing a data compression algorithm in accordance with an embodiment of the present invention.

FIG. 1 illustrates a communication system 10 that employs a data compression algorithm in accordance with the present invention. The communication system 10 comprises a first computer terminal 15 connected by a communication link 20 to a second computer terminal 25. The computer terminal 15 comprises an encoder/decoder unit or modem 30. The encoder in modem 30 is capable of compressing data before being sent along communication link 20. The encoder 30 utilizes a dictionary that comprises the strings encountered during the compression process. The second computer terminal 25 comprises an encoder/decoder unit or modem 35. The modems 30 and 35 can be integrated into the computer or connected as a stand-alone unit.

The decoder in modem 35, like the encoder in modem 30, utilizes a dictionary that comprises the strings built during the de-compression process. During data communication between the first computer terminal 15 and the second computer terminal 25, the dictionaries in each of the encoder and decoder in the respective modems 30 and 35 are typically built as more data is sent. The principal characteristics of the data compression procedure preferably are: a) a compression procedure based on an algorithm that encodes strings of characters input from data terminal equipment (DTE) as binary codes of variable length; b) a decoding procedure that recovers the strings of characters from received binary codes of variable length; c) a string-building mechanism that rapidly extends existing strings and d) an automatically invoked transparent mode of operation when uncompressible data are detected.

Figure 2:
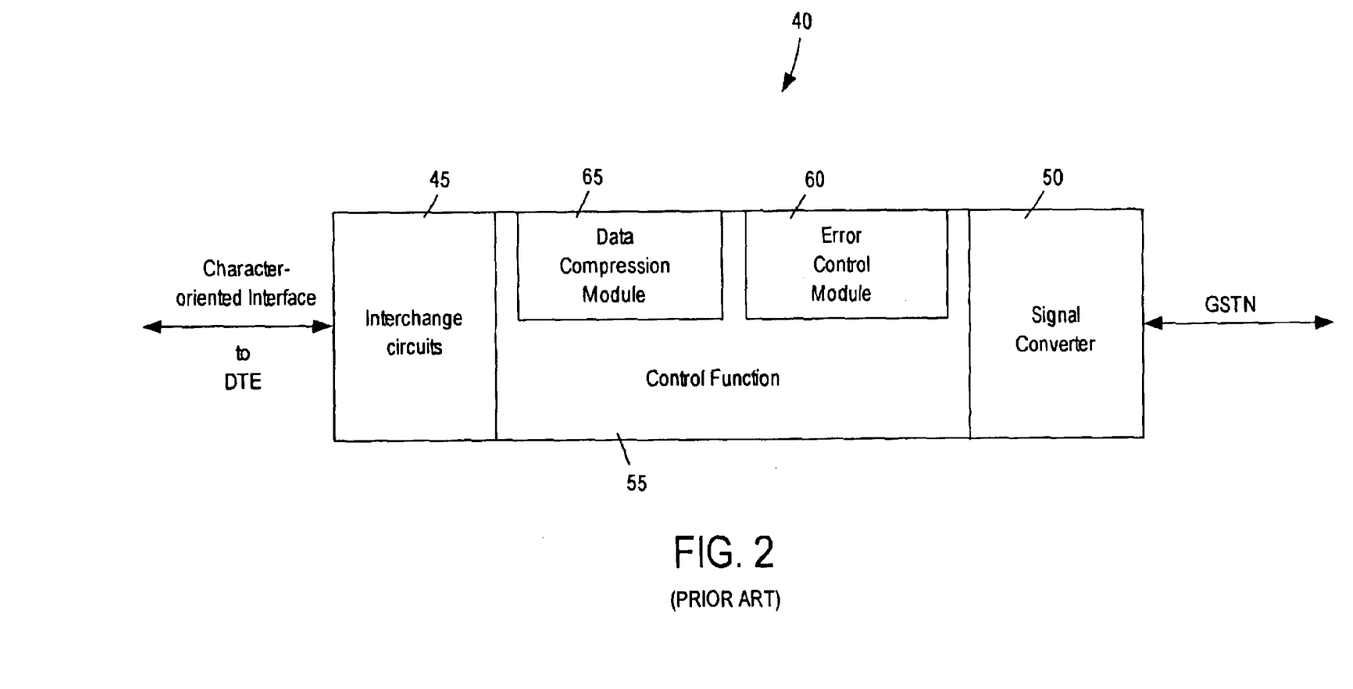
FIG. 2 illustrates a data circuit terminating equipment according to an embodiment of the present invention.

The modems 30 and 35 are examples of a data circuit terminating equipment (DCE) 40 employing a data compression module in accordance with the present invention. A DCE 40 employing data compression, as depicted in FIG. 2, comprises the following components: a) DTE/DCE interchange circuits 45; b) a signal converter 50; c) a control function 55; d) an error-control module 60 and e) a data compression module 65. The DTE/DCE interchange circuits 45 and signal converter 50 have capabilities as specified for a V.42 link. The control function 55 performs the following operations: a) negotiation of modes of operation of the data compression module 65 with the remote DCE, and negotiation of parameters associated with the operation of the data compression module; b) initialization or re-initialization of the data compression module 65; c) co-ordination of the establishment of an error-controlled connection for use by the peer data compression modules; d) co-ordination of the delivery of data between the DTE/DCE interface circuits 45 and the data compression module 65, in accordance with the procedures defined for V.42 links, including the provision of the flow-control procedures defined therein; e) co-ordination of the delivery of data between the data compression module 65 and the error control module 60 and f) action on detection of an exception condition.

The error control module 60 implements the capabilities as specified for a V.42 link. The data compression module 65 preferably implements the procedures defined in the ITU-T Recommendation V.44 in order to efficiently encode data prior to transmission over an error-controlled connection. It performs the following operations: a) initialization and re-initialization of the encoder and decoder dictionaries; b) data compression encoding and decoding; c) switching between compressed and transparent modes of operation and d) configuration of an encoder and a decoder provided by the data compression module 65 in accordance with the parameters negotiated by the control function.

Communication between the control function 55 and the data compression module 65 is accomplished via a set of abstract primitives of the form X-NAME_type that represent the logical exchange of information and control to accomplish a task or service. The control function 55 is viewed as the "service user" while the data compression module 65 is viewed as the "service provider." The types of primitives are: request, indication, response, and confirm. The services used in accordance with the present invention are listed in Table 1.

TABLE 1

V.44 - Services expected by the control function

| Service | Primitive |
|---|---|
| Initialize the data compression module | C-INIT |
| Transfer negotiation parameters to/from the data compression module | C-PARM |
| Indicate an error to the control function | C-ERROR |

TABLE 1-continued

V.44 - Services expected by the control function

| Service | Primitive |
|---|---|
| Transfer uncompressed data to/from the data compression module | C-DATA |
| Transfer compressed data to/from the data compression module | C-TRANSFER |
| Flush remaining un-transferred data from the encoder | C-FLUSH |

The control codes and commands used for communication between peer data compression modules are in Table 2 and Table 3.

TABLE 2

V.44 - Control codes used in compressed mode

| Code | Name | Description |
|---|---|---|
| 0 | ETM | Enter Transparent Mode |
| 1 | FLUSH | Flush data |
| 2 | STEPUP | Increase codeword size or ordinal size by one |
| 3 | REINIT | Force re-initialization of dictionaries |

TABLE 3

V.44 - Commands used in transparent mode

| Value | Name | Description |
|---|---|---|
| 0 | ECM | Enter Compressed Mode |
| 1 | EID | ESCAPE In Data |
| 2 | EPM | Enter Parameter Mode |
| Variable | ESCAPE | Initiates a command sequence |

Prior to initiating the data compression module, the modem peers must determine if they have V.44 capability. V.44 capability is determined upon link establishment through a protocol (for example, the exchange of identification (XID) procedure defined in V.42 links), and remains in-effect for the duration of the error-corrected connection. In particular, when using this invention with V.42 error control, the XID negotiation procedure can be used (see ISO/IEC 13239). Parameters within the user data sub-field, in addition to those defined in V.42 links, are used for this purpose. The user data sub-field appears in the XID frame immediately before the FCS and is encoded.

The presence of the "V.44 capability" parameter within an XID message (or other protocol message) indicates that the sending entity has the capabilities provided by the present invention. It should be noted that certain bits within this parameter are ignored while negotiating over modem connections, as they specify V.44 capabilities for use in packet networks. During the protocol establishment phase, the presence of parameter type 0×40 with a Parameter Set Identifier of "V.44" in the User Data Sub-field of the XID frame can indicate a request for V.44 data compression. The responder can include parameters for at most one compression algorithm (V.42 bis or V.44) in the response XID. Once V.44 capability has been determined, the values of the data compression parameters can be negotiated between the data compression peers.

Table 4 defines the parameters negotiated between peer data compression modules. The "P" parameters are the values proposed by either side of the negotiation, and the "N" parameters are the values finally agreed. Table 5 defines all data compression operating parameters. (MSB indicates most significant byte, LSB indicates least significant byte.).

TABLE 4

V.44 - Negotiation parameters for data compression module

| Parameter | Identifier 8........1 | Length (octets) | Value 8........1 | Meaning | Range | Default | Agreed Value |
|---|---|---|---|---|---|---|---|
| | 00000000 01000000 | | | Not used | | | |
| $C_0$ | 01000001 | 00000001 | PM00000N | V.44 capability. Value of N: 0 parameter negotiation via protocol (i.e., XID) 1 parameter negotiation after link establishment Bits P and M are not used by modem connections: see Annex B. | | | |
| $P_0$ | 01000010 | 00000001 | 000000RT | Data compression request: Value of RT: 00 neither direction 01 only in transmit direction 10 only in receive direction 11 both directions | 00–11 | 11 | |
| $P_{1T}$ | 01000011 | 00000010 | (MSB) (LSB) | Proposed number of codewords (including control codes) in the transmit direction | 256–65535 | 1024 | $N_{2T}$ |
| $P_{1R}$ | 01000100 | 00000010 | (MSB) (LSB) | Proposed number of codewords (including control codes) in the receive direction | 256–65535 | 1024 | $N_{2R}$ |
| $P_{2T}$ | 01000101 | 00000001 | | Proposed maximum string length for the transmit direction | 32–255 | 255 | $N_{7T}$ |
| $P_{2R}$ | 01000110 | 00000001 | | Proposed maximum string length for the receive direction | 32–255 | 255 | $N_{7R}$ |
| $P_{3T}$ | 01000111 | 00000010 | (MSB) (LSB) | Proposed length of history for the transmit direction | $\geq 512$ | $3 * P_{1T}$ | $N_{8T}$ |
| $P_{3R}$ | 01001000 | 00000010 | (MSB) (LSB) | Proposed length of history for the receive direction | $\geq 512$ | $3 * P_{1R}$ | $N_{8R}$ |
| | 01001001– 11111110 | | | Reserved for future use | | | |
| End | 11111111 | | | End of Parameters: exit parameter mode | | | |

TABLE 5

V.44 - Operating parameters for data compression module

| Parameter | Meaning | Value |
|---|---|---|
| $N_{1T}, N_{1R}$ | Maximum codeword size (in bits) | Derived from $N_{2T}, N_{2R}$ |
| $N_{2T}, N_{2R}$ | Maximum number of codewords (including control codes) | See Table 4 |
| $N_3$ | Input character size, in bits | 8 |
| $N_4$ | Number of characters in alphabet | 256 |
| $N_5$ | Number of control codes & first available codeword | 4 |
| $N_6$ | Reserved | |
| $N_{7T}, N_{8R}$ | Maximum string length | See Table 4 |
| $N_{8T}, N_{8R}$ | History size | See Table 4 |

Table 6 defines variables used in the operation of the data compression module. A separate set of these variables must be maintained by the encoder and decoder.

TABLE 6

V.44 - Operating vanables for data compression module

| Parameter | Meaning |
|---|---|
| $C_1$ | Codeword value of next available entry of node-tree (in encoder) or string collection (in decoder) |

TABLE 6-continued

V.44 - Operating vanables for data compression module

| Parameter | Meaning |
|---|---|
| $C_2$ | Current codeword size, in bits |
| $C_3$ | Threshold for changing the codeword size; equals 2 to the power $C_2$. Only used by the encoder. |
| $C_4$ | Current position in history |
| $C_5$ | Ordinal size, in bits |

The "P" parameters are the values proposed by either side of the negotiation, and the "N" parameters are the values finally agreed upon by the participating DTE/DCE such as the modems 30 and 35 in FIG. 1. The parameters for data compression can differ for the two directions of transmission, that is, between the encoder of modem 30 and the decoder of modem 35, and the encoder of modem 35 and the decoder of modem 30. During negotiation, either side of the connection can propose values for any of these parameters. The subscript "T" indicates that the parameter refers to the transmit direction (encoder) of the entity sending the message. The subscript "R" indicates that the parameter refers to the receive direction (decoder) of the entity sending the message. Thus, in negotiating the directions in which data compression operates, the complementary response to one entity's $P_0$ value of 01 (proposing operation only in the direction of the sending entity's encoder and the responding entity's decoder) is a $P_0$ value of 10 (agreeing to operation only in the direction of the responding entity's decoder and the (original) sending entity's encoder). A response of 01 or 11 can inappropriately propose data compression in a direction not originally requested. A response of 00 can result in data compression in neither direction.

In negotiating parameter values, the lesser value of two proposals is used. For example, the proposed $P_{2T}$ from one entity is compared with the proposed $P_{2R}$ from the other entity. If both values are valid, the lesser value can be used. Any attempt to specify a value less than the minimum is a procedural error and can result in disconnection. The final agreed value is set into $N_{7T}$ by the entity proposing $P_{2T}$ and into $N_{7R}$ by the entity proposing $P_{2R}$. The negotiation of these values preferably proceeds in one of two ways, as indicated in the V.44 capability parameter value, that is, either through the XID capability determination itself, or through negotiation after link establishment.

In the User Data Sub-field of the XID, the V.44 capability parameter indicates how the data compression parameters are to be negotiated. If it indicates that XID procedures are to be used, the values proposed by the sending entity are included later in the same sub-field. If the V.44 capability parameter indicates that parameter negotiation is to take place after the error-corrected link is established, the control function 55 performs this after link establishment and anytime thereafter, as it deems necessary. The control function 55 does insure that data transfer between the data compression peers is not in-progress, and that flow control is in-effect, prior to initiating parameter negotiation.

The control function 55 uses C-PARM primitives to pass parameters to/from the data compression module 65, as follows:
Upon receipt of a C-PARM_request from the control function 55, the encoder can:
Transition from compressed mode to transparent mode, or else remain in transparent mode;
Transition to parameter mode and transfer the EPM (Enter Parameter Mode) command to indicate this transition to the peer decoder;
Transfer the parameters passed with the C-PARM_request to the peer decoder;
Transfer the End parameter to indicate a transition to transparent mode to the peer decoder;
Issue a C-PARM_confirm to the control function; or
Transition to transparent mode.
Upon receipt of a C-PARM_confirm from the data compression module 65, the control function 55 can:
If the parameters just transferred to the peer decoder successfully complete parameter negotiation, the control function 55 re-initializes the data compression module;

Otherwise, the control function 55 can continue to flow control pending receipt of parameters from the data compression peer.
Upon receipt of an EPM command from the peer encoder while in transparent mode, the decoder can:
Transition to parameter mode;
Receive the parameters;
Transition to transparent mode when the End parameter is received;
Issue a C-PARM_indication to the control function 55 passing to it the received parameters.
Upon receipt of a C-PARM_indication from the data compression module 65, the control function 55 can:
If the parameters passed with the C-PARM_indication successfully complete parameter negotiation, the control function 55 can re-initialize the data compression module;
Otherwise, the control function 55 can issue a C-PARM_request to transfer responding parameters to its data compression peer.

After successful negotiation of V.44 capability, the control function 55 can issue the primitive C-INIT_request to the data compression module 65. If the V.44 data compression parameters have been negotiated within the XID message exchange, the C-INIT primitive indicates the negotiated value of the parameters; otherwise, the C-INIT primitive indicates the default value of the parameters. The data compression module 65 initializes the encoder dictionary to a state, and the decoder dictionary to the state. The data compression module 65 is set to compressed mode, and the ESCAPE is assigned the value 0.

A data compression module 65 re-initialization can be invoked by the control function 55. The control function 55 issues a C-INIT_request to the data compression module 65 on the following conditions:
Receipt of L-ESTABLISH_indication or L-ESTABLISH_confirm;
Receipt of L-SIGNAL_indication or L-SIGNAL_confirm, where the primitive indicates a destructive form;
Receipt of C-PARM_indication which successfully completes parameter negotiation initiated by this entity. The C-INIT primitive indicates the just-negotiated value of the parameters; or
Receipt of C-PARM_confirm which successfully completes parameter negotiation initiated by the data compression peer. The C-INIT primitive indicates the just-negotiated value of the parameters.

It is the responsibility of the control function 55 to ensure that C-INIT_request primitives are issued only when no data are in transit between the data compression functions (e.g. in the error-control functions), to ensure synchronization between the encoders and decoders. The initial values for the encoder variables are:
The "next codeword" $C_1=N_5$
The "current codeword size" $C_2=6$
The "threshold for changing the codeword size" $C_3=64$
The "current history position" $C_4=0$
The "current ordinal size" $C_5=7$
All down-indices in the root array are set to non-valid values
The initial values for the decoder variables are:
The "next codeword" $C_1=N_5$
The "current codeword size" $C_2=6$
The "current history position" $C_4=0$
The "current ordinal size" $C_5=7$ On receipt of the primitive C-INIT_confirm from the data compression module 65, the control function 55 indicates to the DTE (e.g., computer 15 or 25) that data transfer may commence. On completion of connection establishment, the control function 55 requests encoding of data input to the DTE/DCE interface. To encode data, the control function 55 issues the primitive C-DATA request to the data compression module 65. The primitive indicates the data to be encoded. On receipt of the primitive C-DATA_indication from the data compression module 65, the control function 55 delivers the decoded data to the DTE/DCE interface. Flow-control procedures are used to avoid potential loss of data due to buffer overflow. Characters input from the control function 55 are encoded.

On receipt of the primitive C-TRANSFER_indication from the data compression module 65, the control function 55 issues the primitive L-DATA_request to the error-control module 60. On receipt of the primitive L-DATA_indication from the error-control module 60, the control function 55 issues the primitive C-TRANSFER_request to the data compression module 65.

During the course of operation, certain variables are autonomously changed by the data compression module 65. The mode of operation can also change autonomously from compressed mode to transparent mode.

At dictionary re-initialization, the encoder and its peer decoder initialize for the transfer of an ordinal of 7 bits ($C_5=7$). When the encoder is about to transfer the first ordinal with numerical value greater than $127_{10}$, it sets $C_5$ to 8. If it is in compressed mode, it also transfers the STEPUP control code immediately before transferring the prefix and ordinal.

The codewords and control codes are transferred using the number of bits defined by $C_2$. At dictionary re-initialization, $C_2$ is set to the value of 6 and $C_3$ is set to the value of 64. When the encoder is about to transfer a codeword with numerical value greater than or equal to $C_3$:
a) the encoder transfers the STEPUP control code, using the current codeword size, $C_2$;
b) the codeword size $C_2$ is increased by one;
c) $C_3$ is doubled;
d) if the codeword to be transferred is still numerically greater than or equal to $C_3$, steps a) through c) are repeated. Then the prefix and codeword are transferred.

When the encoder is unable to create a new codeword because the node-tree is full ($C_1=N_{2T}$), it re-initializes the dictionary. When the history is full ($C_4=N_{8T}$), the encoder terminates any string-matching or string-extension activity in progress, transfer the code or codes that result, and re-initialize the dictionary. The next input character is placed in the first position of the history.

The encoder periodically applies a test to determine the compressibility of the data. The nature of the test can consist of a comparison of the number of bits required to represent a segment of the data stream before and after compression, although other tests can be used.

The monitoring of the data stream for compressibility continues in both compressed and transparent modes of operation. In compressed mode, if the encoder determines that the data stream is not compressible, it transitions to transparent mode. In transparent mode, if the encoder determines that the data stream is compressible, it transitions to compressed mode.

The encoder dictionary is re-initialized by being set to the state. If the data compression module 65 is in compressed mode, the encoder also transfers the REINIT control code; and the decoder, upon the receipt of the REINIT, sets the decoder dictionary to the state.

Under certain circumstances, it may be necessary that string-matching or string-extension be terminated and any partially encoded data be transferred immediately. An example is if the error-control module were in idle condition. The control module 55 issues a C-FLUSH_request primitive to the data compression module 65, and then transfers the remaining data. If the data compression module 65 is in compressed mode, upon receipt of a C-FLUSH_request from the control function 55, the encoder:
a) terminates string-matching or string-extension procedures;
b) transfers the remaining code(s);
c) updates the encoder dictionary as appropriate;
d) transfers the FLUSH control code;
e) if necessary, transfers enough 0 bits to establish octet-alignment.

The encoder dictionary is not re-initialized. The dictionary is updated, as appropriate, by appending the character following the flush. Upon receipt of a FLUSH control code, the decoder establishes octet alignment. The decoder dictionary is not re-initialized, and the receipt of the FLUSH control code does not affect the creation of new strings. The decoder processes the code received after the FLUSH in continuity with the code received just before the FLUSH, in accordance with the decoder string creation process. If the data compression module is in transparent mode, upon receipt of a C-FLUSH[13] request from the control function, the encoder preferably transfers all data input up to that point.

A transparent mode command sequence consists of the ESCAPE, followed by one of the commands listed in Table 3 above, except ESCAPE. The value of the ESCAPE is variable. At initialization of the data compression module, it is assigned the value 0. During transparent mode, if the current value of the ESCAPE is detected within the data stream from the DTE, the detected ESCAPE is transferred and followed immediately by the EID command. The current value of the ESCAPE is then changed by adding to it $51_{10}$, the addition performed modulo 256. Note that while in compressed or parameter mode, the current value of the ESCAPE is not modified if detected within the data stream from the DTE.

The C-ERROR_indication is used to inform the control function 55 that an exception (for example, a procedural error or loss of synchronization) has been detected by the data compression module 65. The control function 55 takes appropriate recovery action, including reestablishment of the error-corrected connection. The following conditions recognized by the decoder result in the generation of a C-ERROR_indication primitive:
receipt of a STEPUP control code that would cause the value of $C_2$ to exceed $N_1$;
receipt of a STEPUP control code that would cause the value of $C_2$ to exceed 8; or
receipt of a codeword greater than $C_1$.

Figure 3:
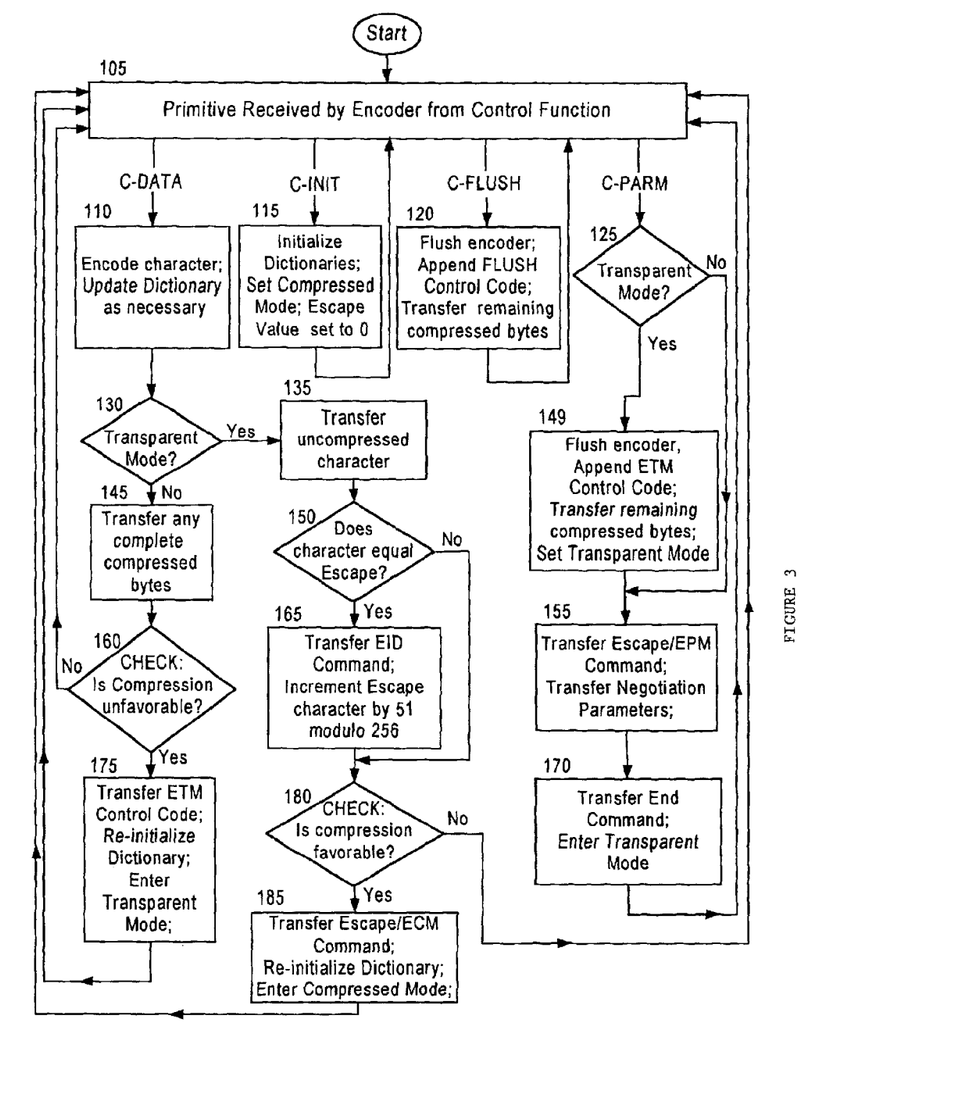
FIG. 3 is a flow chart illustrating a sequence of operations executed by an encoder for implementing parameter negotiation in parameter mode and modification of the escape character according to an embodiment of the present invention

FIG. 3 is a flow chart illustrating the encoder of a data compression module 65 in accordance with an embodiment of the present invention. Control and data are passed to the encoder in the form of primitives (step 105) from the control function 55. At the step 115, the encoder is initialized and set to compressed mode. While receiving data (step 110) in compressed mode, the dictionary is built by the encoder that comprise the strings that are encountered during processing of the input characters from the control function 55. The information in the encoder dictionary represents the same strings as that of the decoder dictionary when it processes the compressed data, although the dictionaries themselves are not the same format. The value of the encoder ESCAPE character is set to zero when the compression encoder is initialized and it is not modified while in compressed mode when an input character equals the value of the ESCAPE character.

While in compressed mode, data is being sent from the encoder to the decoder in a compressed format. While doing so, a compression check is periodically applied to determine whether or not it would be more favorable to send the data transparently without any compression (step 160). If it is more favorable not to compress the data, the encoder issues an 'Enter Transparent Mode (ETM) control code to the decoder to indicate to the decoder that data will no longer be sent in compressed form. If is determined that it is more favorable to compress the data, the encoder remains in compressed mode (step 145).

In transparent mode (step 135), data is sent uncompressed between the encoder and the decoder. While in transparent mode, the encoder continues to compress the data and update its dictionary of strings even though it sends the input characters to the decoder uncompressed. This is necessary because the encoder needs to determine when it is more favorable to return to compressed mode (step 180) and to needs to periodically apply the compressibility check using the result of the compression. While in transparent mode, the decoder does not update its dictionary and simply handles the data received from the encoder as uncompressed characters.

The ESCAPE character transferred in transparent mode indicates that one of the commands listed in Table 3 will follow, except for the Escape In Data (EID). If the encoder determines (step 180) that a better compression ration is achieved by compressing the data than by not compressing the data then the encoder transitions to compressed mode. When transitioning from transparent mode to compressed mode (step 185), the ESCAPE character is transferred followed by the 'Enter Compressed Mode' (ECM) command and the encoder dictionary is re-initialized. When the decoder subsequently receives the ECM command, it will re-initialize its dictionary and transition to compressed mode.

While in transparent mode, if a character is received that equals the current value of the ESCAPE character is received, an Escape In Data (EID) command is transferred by the encoder (step 165), after the character is transferred. The value of the ESCAPE character is incremented by 51 modulo 256 (step 165) to prevent excessive data expansion if many reoccurrences of the same ESCAPE character appear in a string of input data. In accordance with an advantage of the present invention, the escape character is not incremented in compressed mode.

If the control function passes compression parameters or an algorithm switch (via a C-PARM) to the encoder (step 125), the encoder transitions to parameter mode. If in compressed mode, the encoder first transitions to transparent mode (step 140) and sends an ETM control code to the peer encoder. Parameter mode is where modification and negotiation of data compression parameters occurs, as well as switching data compression algorithms (step 155). Tables 4 through 6 summarize the parameter negotiation that takes place between the encoder and the decoder in parameter mode. Following parameter transfer, the encoder exits parameter mode ( ), as indicated by the last entry of Table 4, and returns to transparent mode (step 170).

While the preferred embodiment has been set forth with a degree of particularity, it is to be understood that changes and modifications could be made to the construction thereof which would still fall within the teachings of the claimed invention as set forth in the following claims.

What is claimed is:

1. A data compression system for compressing and decompressing data transported via a communications channel, comprising:

a compression encoder allowing said data to be transmitted in a compressed mode through said communications channel; and a decompression decoder allowing said data to be reconstructed after being sent through said communications channel, wherein the value of an escape character that is used to indicate the beginning of a command when in transparent mode is not modified during said data compression and decompression.

2. A data compression system as claimed in claim 1, wherein said data passes through said encoder and said decoder uncompressed in a transparent mode.

3. A data compression system as claimed in claim 2, wherein the value of said escape character is modified when encountered while in said transparent mode.

4. A data compression system as claimed in claim 2, wherein a command follows an escape character when in said transparent mode.

5. A data compression system as claimed in claim 3, wherein said escape character is initialized at zero and is modified 51 modulo 256 upon encountering said escape character in said transparent mode.

6. A data compression system as claimed in claim 4, wherein a parameter mode may be entered from said transparent mode upon sending an 'Enter Parameter Mode' command from said encoder to said decoder wherein parameter negotiation between said encoder and said decoder can occur without disrupting said communication channel.

7. A data compression system as claimed in claim 6, wherein said parameter negotiation determines whether data is transmitted in a transmit direction, a receive direction, in both transmit and receive directions, or in neither direction.

8. A data compression system as claimed in claim 6, wherein said parameter negotiation comprises a selected dictionary size for the transmit and the receive directions.

9. A data compression system as claimed in claim 6, wherein said parameter negotiation comprises a proposed maximum string length for the transmit and the receive directions.

10. A data compression system as claimed in claim 6, wherein parameter negotiation comprises a proposed length of history for the transmit and the receive directions.

11. A data compressing system for compressing and decompressing data transported via a communications channel, comprising:

a compression encoder allowing said data to be transmitted in a compressed mode through said communications channel; and a decoder allowing said data to be reconstructed after being sent through said communications channel in said compression mode, wherein said encoder and said decoder are selectively operable in any of a compression mode wherein said data is compressed before it is sent through said communication channel, a transparent mode wherein said data is not compressed before transmission via said communication channel, and a parameter mode wherein negotiation of data compression parameters can occur; and wherein said parameter mode is entered only from transparent mode.

12. A data compression system for compressing and decompressing data transported via a communications channel, comprising:

a compression encoder allowing said data to be transmitted in a compressed mode through said communications channel; and a decoder allowing said data to be reconstructed after being sent through said communications channel in said compression mode, wherein said encoder and said decoder are selectively operable in any of a compression mode wherein said data is compressed before it is sent through said communication channel, a transparent mode wherein said data is not compressed before transmission via said communication channel, and a parameter mode wherein negotiation of data compression parameters can occur; and wherein said negotiation of data compression parameters occurs in the absence of tearing down and re-establishing said communication channel; and wherein said parameter negotiation comprises a proposed length of history for the transmit and the receive directions.

13. A data compression system for compressing and decompressing data transported via a communications channel, comprising:

a compression encoder allowing said data to be transmitted in a compressed mode through said communications channel; and a decoder allowing said data to be reconstructed after being sent through said communications channel in said compression mode, wherein said encoder and said decoder are selectively operable in any of a compression mode wherein said data is compressed before it is sent through said communication channel, a transparent mode wherein said data is not compressed before transmission via said communication channel, and a parameter mode wherein negotiation of data compression parameters can occur; and wherein an escape character, which is used to indicate that a command will follow, followed by a command is communicated via said communication channel prior to switching from said transparent mode to said parameter mode and switching from said transparent mode to said compression mode.

14. A data compression system for compressing and decompressing data transported via a communications channel, comprising:

a compression encoder allowing said data to be transmitted in a compressed mode through said communications channel; and a decoder allowing said data to be reconstructed after being sent through said communications channel in said compression mode, wherein said encoder and said decoder are selectively operable in any of a compression mode wherein said data is compressed before it is sent through said communication channel, a transparent mode wherein said data is not compressed before transmission via said communication channel, and a parameter mode wherein negotiation of data compression parameters can occur; and said encoder and said decoder each further comprise a dictionary of data and their compressed equivalents, wherein said decoder dictionary is not updated while said data compression system is in transparent mode.

15. A data compression system for compressing and decompressing data transported via a communications channel, comprising:

a compression encoder allowing said data to be transmitted in a compressed mode through said communications channel; and a decoder allowing said data to be reconstructed after being sent through said communications channel in said compression mode, wherein said encoder and said decoder are selectively operable in any of a compression mode wherein said data is compressed before it is sent through said communication channel, a transparent mode wherein said data is not compressed before transmission via said communication channel, and a parameter mode wherein negotiation of data compression parameters can occur; and said encoder and said decoder each further comprise a dictionary of data and their compressed equivalents, wherein each said dictionary is re-initialized when said data compression system switches from transparent mode to compression mode.

16. A method for negotiating data compression parameters in a data compression system without interrupting a communication channel over which compressed data is transmitted, said data compression system comprising an encoder at one end of said communication channel capable of compressing data and a decoder at the other end of said communication channel capable of decompressing data, said method comprising the steps of:

transmitting data over said communication channel in a compressed mode, wherein said encoder compresses said data to be sent along said communication channel and said decoder decompresses said data;

switching said data compression system to a transparent mode wherein said encoder continues to compress data but sends the data transparently along said communication channel to said decoder; transmitting data over said communication channel in an uncompressed format wherein said decoder is transparent to said data;

switching said data compression system to a parameter mode; negotiating data compression parameters in said parameter mode between said encoder and said decoder;

switching said data compression system back to said transparent mode; and switching said data compression system back to said compressed mode allowing data to be transmitted over said communication channel in a compressed format.

17. A method as claimed in claim 16, the step of switching said data compression system to a transparent mode further comprises the steps of sending an enter transparent mode control code from said encoder to said decoder.

18. A method as claimed in claim 16, wherein said step of switching from said transparent mode back to said compressed mode comprises the steps of:

sending an escape character from said encoder to said decoder; and sending an enter compress mode command from said encoder to said decoder.

19. A method as claimed in claim 16, wherein said step of switching from said transparent mode to said parameter mode comprises the steps of:

sending an escape character from said encoder to said decoder; and sending an enter parameter mode command from said encoder to said decoder.

20. A method as claimed in claim 16, wherein said step of switching from said transparent mode back to said compressed mode comprises the step of re-initializing a dictionary in each of said encoder and said decoder.

21. A method as claimed in claim 16, wherein said step of transmitting data over said communication channel in a compressed mode is accomplished without modification of the value of the escape character, a variable used to indicate that a command will follow.

22. A method as claimed in claim 16, wherein said step of transmitting data over said communication channel in an uncompressed format wherein said encoder and said decoder are transparent to said data further comprises modifying the value of the escape character, a variable used to indicate that a command will follow, when the escape character is encountered.

23. A method as claimed in claim 22, wherein said escape character is modified by incrementing said escape character by 51 modulo 256.

24. A method as claimed in claim 16, wherein said step of negotiating data compression parameters in said parameter mode between said encoder and said decoder comprises establishing whether or not data is to be sent in a transmit direction, a receive direction, both directions, or neither direction.

25. A method as claimed in claim 16, wherein said step of negotiating data compression parameters in said parameter mode between said encoder and said decoder comprises proposing a number of codewords in a transmit direction and a receive direction.

26. A method as claimed in claim 16, wherein said step of negotiating data compression parameters in said parameter mode between said encoder and said decoder comprises proposing the maximum string length in a transmit direction and in a receive direction.

27. A method as claimed in claim 16, wherein said step of negotiating data compression parameters in said parameter mode between said encoder and said decoder comprises proposing the length of history for a transmit direction and a receive direction.

28. A method as claimed in claim 16, wherein the step of switching said data compression system back to said transparent mode from said parameter mode comprises sending an end parameter command from said encoder to said decoder.

* * * * *